United States Patent
Perritt, Jr.

(10) Patent No.: US 12,399,206 B1
(45) Date of Patent: Aug. 26, 2025

(54) UNMANNED AERIAL VEHICLE FOR MEASURING AND MAPPING ELECTROMAGNETIC FIELD STRENGTH

(71) Applicant: Henry Hardy Perritt, Jr., Charlottesville, VA (US)

(72) Inventor: Henry Hardy Perritt, Jr., Charlottesville, VA (US)

( * ) Notice: Subject to any disclaimer, the term of this patent is extended or adjusted under 35 U.S.C. 154(b) by 0 days.

(21) Appl. No.: 19/093,359

(22) Filed: Mar. 28, 2025

(51) Int. Cl.
| | | |
|---|---|---|
| G01R 29/10 | (2006.01) | |
| G01R 29/08 | (2006.01) | |
| G05D 1/656 | (2024.01) | |
| G05D 105/80 | (2024.01) | |
| G05D 109/25 | (2024.01) | |

(52) U.S. Cl.
CPC ......... *G01R 29/10* (2013.01); *G01R 29/0878* (2013.01); *G05D 1/656* (2024.01); *G05D 2105/87* (2024.01); *G05D 2109/254* (2024.01)

(58) Field of Classification Search
CPC .... G01R 29/10; G01R 29/0878; G01R 27/28; G05D 1/656; G05D 2109/254; G05D 2105/87; G05D 2105/89; H04B 17/102; H01Q 1/1257
See application file for complete search history.

(56) References Cited

U.S. PATENT DOCUMENTS

| | | | |
|---|---|---|---|
| 9,681,320 B2 | 6/2017 | Johnson | |
| 9,802,701 B1 | 10/2017 | Hawes | |
| 10,067,172 B1 * | 9/2018 | Sternowski | G08G 5/00 |
| 10,466,700 B1 * | 11/2019 | Carmack | G05D 1/101 |
| 10,496,088 B2 | 12/2019 | Johnson | |
| 11,150,671 B2 * | 10/2021 | Di Pietro | H04K 3/90 |
| 2015/0183326 A1 * | 7/2015 | Ryberg | B60L 53/00 320/109 |
| 2016/0088498 A1 * | 3/2016 | Sharawi | G01R 29/10 370/241 |
| 2016/0269917 A1 * | 9/2016 | Hillegas, Jr. | H04B 17/336 |
| 2017/0155456 A1 * | 6/2017 | Wennerlöf | H04B 17/12 |
| 2018/0002010 A1 * | 1/2018 | Bauer | G05D 1/689 |
| 2018/0227959 A1 * | 8/2018 | Fraccaroli | H04W 76/14 |
| 2018/0359036 A1 * | 12/2018 | Howard | G01R 29/105 |
| 2023/0375988 A1 * | 11/2023 | Kastl | A01G 25/16 |

\* cited by examiner

*Primary Examiner* — Matthew J. Reda
(74) *Attorney, Agent, or Firm* — Henry H. Perritt, Jr.

(57) ABSTRACT

A system and method for measuring and mapping electromagnetic field strength using an unmanned aerial vehicle (UAV) equipped with a field strength indicator. The UAV records signal power levels while tracking its position via GPS, transmitting data in real-time to a ground station. The ground station software generates detailed maps and charts visualizing antenna signal propagation. Users can customize measurement parameters to achieve desired resolution and granularity. The system and method provide an efficient and automated method for assessing antenna performance across various azimuths and elevations.

11 Claims, 14 Drawing Sheets

GRADIENT-BASED NAVIGATION

AUTONOMOUS AERIAL VEHICLE
108

ELECTROMAGNETIC EMISSIONS
106

ANTENNA
102

FEEDLINE
104

AUTONOMOUS AERIAL
VEHICLE 508

FIVE ELEMENT YAGI 520

FEED LINE 524

BACK EMISSION CONTOUR 526

GRID-BASED NAVIGATION

FLY THE GRADIENT 902

FLY THE CONTOUR 904

GRADIENT-BASED NAVIGATION

HEMISPHERE-BASED NAVIGATION

HEMISPHERE-BASED NAVIGATION

UNMANNED AERIAL VEHICLE FOR MEASURING AND MAPPING ELECTROMAGNETIC FIELD STRENGTH

CROSS-REFERENCE TO RELATED APPLICATIONS

Not applicable

STATEMENT REGARDING FEDERALLY SPONSORED RESEARCH OR DEVELOPMENT

Not applicable

THE NAMES OF THE PARTIES TO A JOINT RESEARCH AGREEMENT

Not applicable

INCORPORATION BY REFERENCE STATEMENT

Not applicable

STATEMENT REGARDING PRIOR DISCLOSURES BY THE INVENTOR OR A JOINT INVENTOR

Not applicable

REFERENCE TO A TABLE/PROGRAM LISTING/OTHER

Not applicable

BACKGROUND

Wireless communication networks and broadcasting systems rely on antennas to transmit signals. Ensuring optimal antenna performance benefits from accurate field strength measurements. Thus, field-strength measurements of antenna emissions have been important since the inception of radio.

Antenna theory provides a foundational framework for understanding how different antenna configurations generate radiation patterns and describes the directional distribution of electromagnetic energy. At HF (High Frequency) frequencies, typically ranging from 3 to 30 megaherz (MHz), the wavelength is relatively long (10 to 100 meters), influencing the design and performance of antennas. A dipole antenna, one of the simplest and most widely used configurations, consists of two conductive elements aligned end-to-end, each a quarter-wavelength long. According to antenna theory, a dipole radiates energy most effectively perpendicular to its axis, creating a toroidal (doughnut-shaped) radiation pattern in three dimensions. At HF frequencies, this pattern is ideal for broad coverage, making dipoles popular for general communication purposes. The radiation pattern can be influenced, however, by the antenna's height above ground, with optimal performance achieved when the dipole is mounted at least half a wavelength above the earth.

At frequencies above HF-above 30 MHz-propagation is line of site. So, the most desirable antenna emission pattern is one that concentrates energy at low azimuths close to the horizon and does not expand energy at high azimuths, where it will simply pass through the ionosphere our into space. At HF frequencies, ionospheric skip is the most important propagation phenomenon for long distance communication, and higher energy concentrated at higher azimuths are desirable. The most efficient azimuth angle depends on the distance between transmitter and receiver and the state of the ionosphere.

Yagi-Uda arrays, commonly referred to as Yagi antennas, are directional antennas that use multiple elements to achieve gain and directivity. A Yagi consists of a driven element (similar to a dipole), a reflector, and one or more directors. The reflector and directors are passive elements that interact with the driven element to focus the radiation pattern in a specific direction. Antenna theory explains that the spacing and length of these elements are carefully tuned to reinforce the signal in the desired direction while canceling it in others. At HF frequencies, Yagi antennas are often used for long-distance communication, such as in amateur radio, national security applications or international broadcasting, because their directional radiation pattern concentrates energy toward the horizon, maximizing range. The gain and directivity of a Yagi increase with the number of directors, but this also narrows the beamwidth, requiring precise alignment for optimal performance.

Vertical antennas, typically monopoles, are another popular configuration, especially for VHF and UHF communication. A vertical antenna consists of a single radiating element mounted perpendicular to the ground, usually with a ground plane or radial system to enhance performance. Antenna theory predicts that a vertical antenna produces an omnidirectional radiation pattern in the horizontal plane, making it ideal for applications where signals need to be transmitted or received uniformly in all directions, such as in maritime or mobile communications. At HF frequencies, vertical antennas are particularly effective for low-angle radiation, which is beneficial for long-distance propagation via ionospheric reflection. The performance of vertical antennas, however, is highly dependent on the quality of the ground plane, as poor grounding leads to signal loss and reduced efficiency. By understanding these principles, engineers and enthusiasts can optimize antenna designs to suit specific communication needs at HF frequencies.

In the near field of antenna radiation, induction and charge effects on the electromagnetic field exist. These effects dissipate rapidly with distance from the antenna and are of little importance beyond one or two wavelengths and are of no significance in evaluating antenna communications efficiency.

In the far field, emissions have settled into an equilibrium that determines the communications effectiveness of the antenna. The far field generally is considered to begin at two wavelengths from the antenna.

In some transmitter sites, operators are interested in knowing the different radiation patterns that can be achieved by different antennas, especially horizontal as opposed to vertical antennas.

While antenna theory provides a robust framework for predicting radiation patterns, real-world conditions often deviate from idealized assumptions, leading to discrepancies between theoretical and practical results. One major factor is the influence of the surrounding environment. Antenna theory typically assumes free-space conditions, where the antenna operates in isolation without obstructions or reflective surfaces. In reality, antennas are installed in complex environments with buildings, trees, terrain, and other structures that can scatter, absorb, or reflect electromagnetic waves. For example, a dipole antenna mounted near a metal roof, or a Yagi array installed close to a hill may experience distorted radiation patterns due to reflections and shadowing effects. Additionally, the ground conductivity and dielectric properties play a significant role, especially for vertical antennas, as poor grounding or uneven terrain can alter the expected low-angle radiation and efficiency.

Other relevant factors are the practical challenges of antenna construction and materials. Theoretical models often assume perfect conductors and precise dimensions, but real-world antennas are subject to manufacturing tolerances, material losses, and environmental wear. For instance, a Yagi array's performance depends on the precise spacing and length of its elements, but even minor deviations during construction can degrade its gain and directivity. Similarly, corrosion, weathering, and mechanical stress can affect an antenna's electrical properties over time. Furthermore, interactions with other nearby antennas or electronic devices can introduce interference, further distorting the radiation pattern. At HF frequencies, atmospheric conditions, such as ionospheric fluctuations and solar activity, also introduce variability that theoretical models cannot fully account for. These real-world complexities highlight the importance of empirical testing and iterative optimization to achieve the desired performance in practical antenna deployments.

Traditional methods for making such measurements involve driving around in a ground vehicle with a suitable antenna, stopping the vehicle periodically, and manually recording signal strength data.

Determining the exact location of the vehicle where each measurement is taken is challenging and requires contemporaneous or prior land-survey data.

Traditional methods involve ground-based measurement equipment, which is often limited in coverage and efficiency. Unmanned aerial vehicles (UAVs) offer a more flexible and comprehensive solution for measuring electromagnetic field strength in three-dimensional space.

A number of references disclose the use of UAVs, or by therefore more formal name of unmanned aerial vehicle (UAV) or autonomous aerial vehicle (AAV), for collecting data about antenna radiation. They do not, however, address regulatory restrictions on UAV operations in effect almost everywhere. So, these references would allow intentional or unintentional UAV operation that violates the law and subjects operators to substantial penalties, including confiscation of the UAV.

The references are vague about how UAV flight paths are to be determined, and allow for inefficient overcapture of data, imposing unnecessary bandwidth and digital memory requirements and increasing the probability of battery exhaustion before data collection is complete. Many of the references do not make explicit use of the inverse square law to extrapolate signal intensity values aggravating the overcapture problem.

Existing UAV-based field measurement systems either lack real-time telemetry or provide only limited data visualization. Therefore, there is a need for an improved system that allows for detailed mapping of electromagnetic fields with high precision while providing real-time data transmission to a ground station for analysis.

The prior art contains no suggestion to extrapolate field strength measurements, to employ gradient-following navigation for the UAV, or to adjust its path dynamically based on signal strength rather than predefined UAV flight paths The references presuppose operator knowledge of the precise location of the antenna whose radiation is to be measured. Such advance knowledge is not always available. In many environments, the precise latitude, longitude, and elevation of the antenna are not known in advance of launching the UAV. Requiring manual input of those values necessitates a user walking around with the geographic measuring device or driving around in a vehicle, which undermines the efficiency advantages of using a UAV to collect data in the first place.

With complicated data collection methods, such as three-dimensional excursions, gradient based navigation, multi-phase sampling, helix flight paths, and predefined grid patterns, the length of time to collect necessary data can exceed flight time available from state-of-the UAV batteries.

Transmitting an un-modulated carrier for the length of time requisite for field strength measurements to be taken all around the antenna are likely to violate regulatory restrictions. Taking field strength measurements on a modulated signal, as one sending an identifier from the transmitted station or the traditional "VVV" in Morse code can mistake variations in signal intensity due to modulation for variations in the strength of the carrier.

BRIEF SUMMARY

A UAV-based system measures, maps, and analyzes the electromagnetic field strength of signals radiated by a transmitting antenna. The UAV is equipped with a field strength indicator that detects signal power levels and transmits the data to a ground station via telemetry. The UAV further integrates global positioning satellite (GPS) positioning, cameras, and other sensors to record its location and associate field strength measurements with precise spatial coordinates.

The system uses direction-finding triangulation to locate the latitude, longitude, and elevation of the antenna.

It then, in one embodiment, flies paths defined by latitudes around virtual hemispheres with radii placing the UAV in the far field of antenna emissions and records data comprising signal strength. In other embodiments its flight paths are defined by grids intersecting the hemispheres or are adjusted dynamically based on signal-strength readings.

It uses the inverse square law to extrapolate signal strength measurements to arbitrary levels appropriate for emission contours.

The ground station receives telemetry data and uses software to generate visual representations such as charts and maps that visualize field strength readings over and around the transmitting antenna. The system enables the user to predefine measurement granularity and customize data collection parameters before each mission. This provides an efficient, automated, and high-resolution method for assessing antenna performance across various azimuths and elevations.

Terms and Definitions

"D" is distance from the antenna

"Dipole" is an antenna with two balanced elements, fed in the middle, between the elements. A dipole does not require a ground plane. A typical dipole is one half-wavelength long.

"Hemisphere" is half of a sphere, the base of which is a circular plane.

"$\lambda$"—the Greek symbol lambda—is wavelength.

Latitude," "longitude," "North Pole," and "equator" are used in two different contexts. In one context, the terms refer to absolute values in objective space. In the second context, they refer to values with respect to a monitoring hemisphere, where in the top of the hemisphere is referred to as the "North Pole" and the bottom, is referred to as the "equator." To avoid confusion the description and claims refer to hemisphere attributes by prefixing them with an S, such as "Slatitude," Slongitude," SNorth Pole," and "Sequator."

"Monopole" is an antenna with one unbalanced element, which requires a ground paint to radiate efficiently. A typical monopole is one quarter wavelength long.

"Radiated power" has the same meaning as "electromagnetic field strength" and "emissions." All three terms refer to the intensity of electromagnetic waves emitted from a radio antenna.

BRIEF DESCRIPTION OF THE SEVERAL VIEWS OF THE DRAWINGS

To identify the discussion of any particular element or act easily, the most significant digit or digits in a reference number refer to the figure number in which that element is first introduced.

DETAILED DESCRIPTION

Unmanned Aerial Vehicle (UAV)

Figure 1:
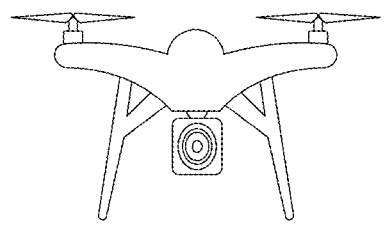
FIG. 1 shows an overview of the UAV, the antenna, and its radiation.
Figure 1:
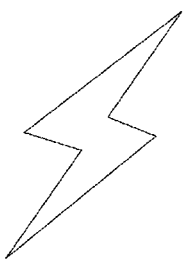
Figure 2:
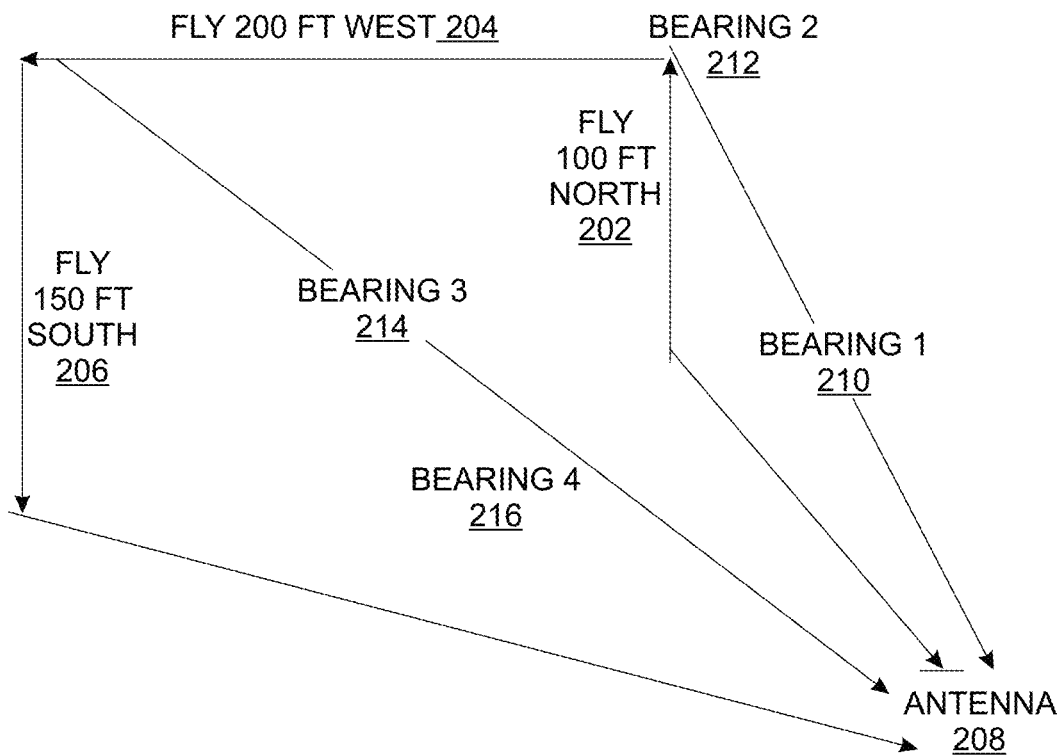
FIG. 2 illustrates the bearings taken to locate the antenna.

The system comprises an unmanned aerial vehicle (UAV) that is configured to measure electromagnetic field strength and generate real-time telemetry data. The UAV has a propulsion system, typically utilizing four rotors driven by electric motors, a plurality of batteries, and comprises the following additional components:

1. Three-dimensional field Strength Indicator—A sensor capable of detecting signal power levels in three dimensions from transmitting antennas.
2. GPS Module—A positioning system that records the UAV's spatial coordinates.
3. Telemetry Transmitter—A communication module that transmits measurement data to the ground station.
4. Telemetry Receiver
5. Command Transmitter
6. Command Receiver
7. Software defined radio receiver—A subsystem capable of processing signals received from the antenna and associating them with geographic coordinates received from the UAVs navigation system
8. Processing Unit—An onboard processor that integrates sensor data, records field strength readings, and formats telemetry output.
9. Cameras and Additional Sensors—The UAV may be equipped with cameras and additional sensors to enhance data and mapping accuracy.
10. Control unit
11. Computer program code
12. A microphone
13. A speech to text converter.

The UAV operates autonomously or under remote control. During flight, it follows a predefined trajectory, measuring field strength at designated points. The GPS module continuously records the UAV's position, associating field strength values with spatial coordinates.

The system makes use of consumer-level UAVs built-in capability of responding to commands to fly a circle of specified radius around a defined point.

The control unit software chooses a transmitter frequency to be monitored by the system. The system can operate at any frequency within the HF (1.6 to 30 megaherz (MHz)), VHF (30-200 megaherz (MHz)), and UHF (300 megaherz (MHz))) to 3 gigaherz (GHz)) bands.

In one embodiment, the system comprises an antenna 102, a feedline 104, electromagnetic emissions 106, and an autonomous aerial vehicle 108.

Locating the Antenna

Emission contours typically are depicted with respect to an antenna. Drawing those contours makes use of the location of the antenna, defined by latitude, longitude, and altitude. The system autonomously determines a latitude, longitude, and elevation of an antenna.

The antenna can be located by triangulation. The UAV flies to three arbitrary points at the same altitude and determines the latitude and longitude of each point by means of the built-in GPS system and the azimuth of the signal from that point by means of the directional antenna onboard the UAV. A vector from each such point is defined by the latitude and longitude of the point and the angle represented by the azimuth. The intersection of the vectors determines the location of the antenna.

In locating the antenna, the system allows for the possibility that the altitude of the UAV may be lower than the elevation of the antenna. As a first step, it asks whether the azimuth for the antenna signal is less than 90°, which would signify that the antenna is above the UAV. If that condition is satisfied, the UAV climbs and takes another direction-finding fix. By using triangulation to locate the antenna, the system eliminates the need for a human being to walk or drive the territory proximate to the antenna to survey, mark, and record its location. This reduces human safety risks and costs of conventional techniques.

The system locates the antenna in space by taking a three-dimensional bearing, bearing 1 210, flying 100 ft north 202, taking bearing 2 212, flying 200 ft west 204 and taking bearing 3 214, and flying 150 ft south 206, and taking bearing 4 216, all bearings being taken on antenna 208. The system then defines vectors from the latitude, longitude, and altitude of the UAV at each point where bearings are taken and the vector to the antenna from that point. The intersection of the vectors constitutes the latitude, longitude, and altitude of the antenna.

Figure 3:
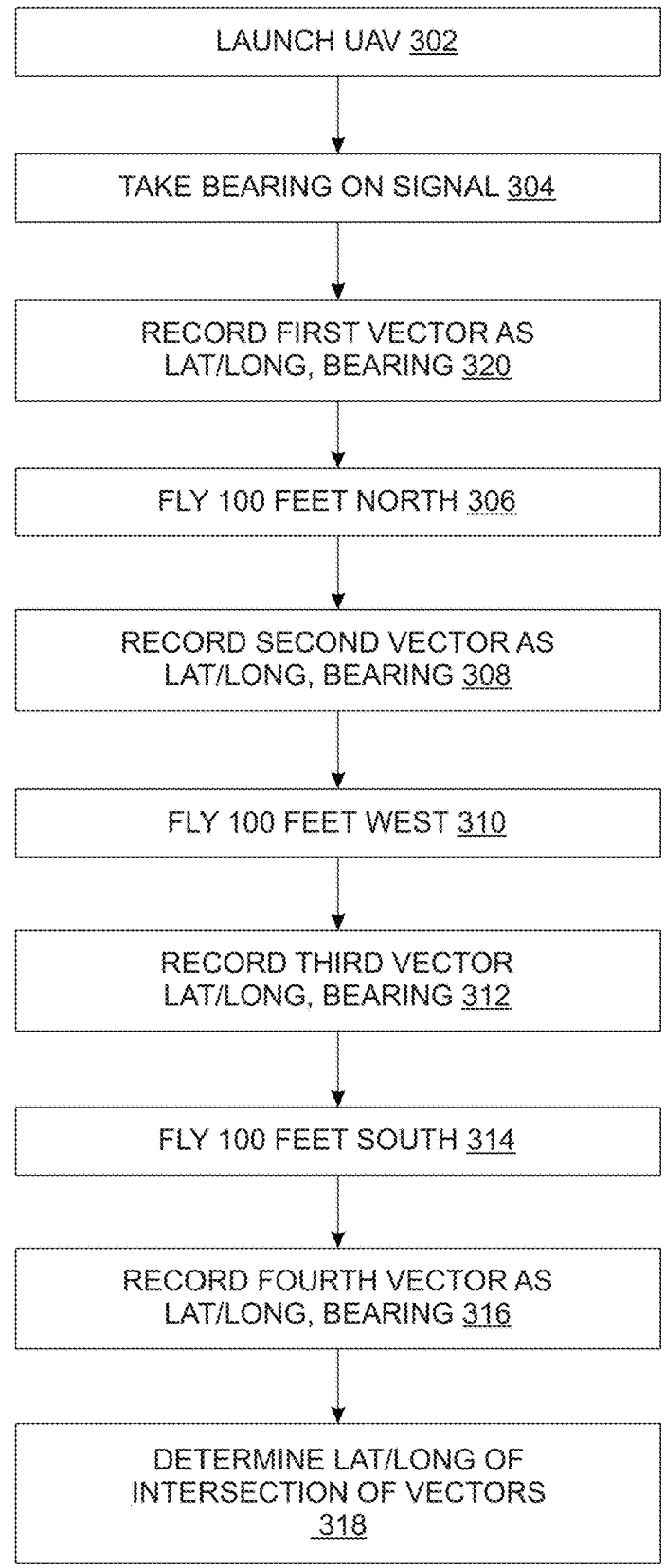
FIG. 3 depicts the steps in determining the location of the antenna.

FIG. 3 illustrates the steps for one method for locating the antenna. A user launches the UAV 302, take bearings on signal 304 and records a first vector as a lat/long bearing 320, flies 100 feet north 306, records a second vector as a lat/long, bearing 308, flies 100 feet west 310 and records a third vector as a lat/long bearing 312, flies 100 feet south 314, and records a fourth vector as lat/long bearing 316. Then, the method includes determining the lat/long of intersection of vectors 318, which represents the location of the antenna 102.

Alternatively a user launches the UAV and manually flies it to a position where it has a good view of the antenna. The user then causes the UAV to take multiple photographs. The UAV uses its GPS-determines position and azimuth and elevation information from the photographs to determine the geographic position of the antenna to enable its collision avoidance algorithms.

Although the example routine depicts a particular sequence of operations, the sequence may be altered without departing from the scope of the present disclosure. For example, some of the operations depicted may be performed in parallel or in a different sequence that does not materially affect the function of the routine. In other examples, different components of an example device or system that implements the routine may perform functions at substantially the same time or in a specific sequence.

Figure 4:
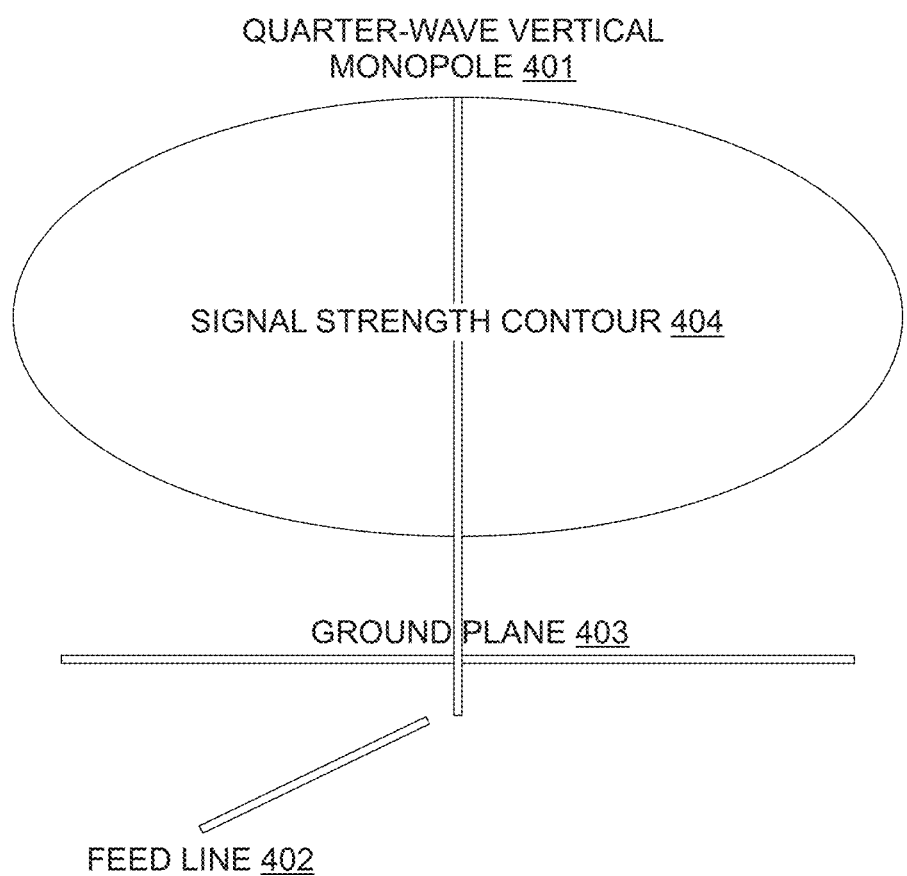
FIG. 4 shows a typical radiation pattern of a vertical monopole.
Figure 5:
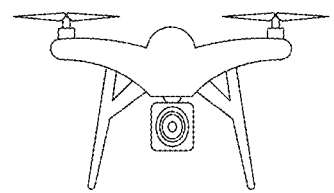
FIG. 5 shows a typical radiation pattern of a horizonal Yagi antenna.
Figure 5:
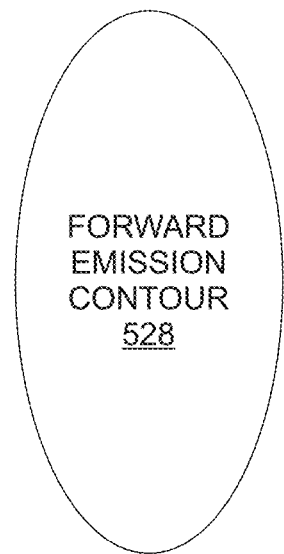
Figure 5:
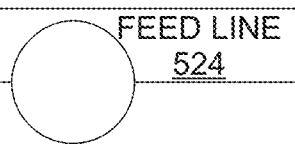
Figure 5:
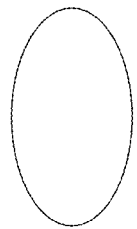
Figure 6:
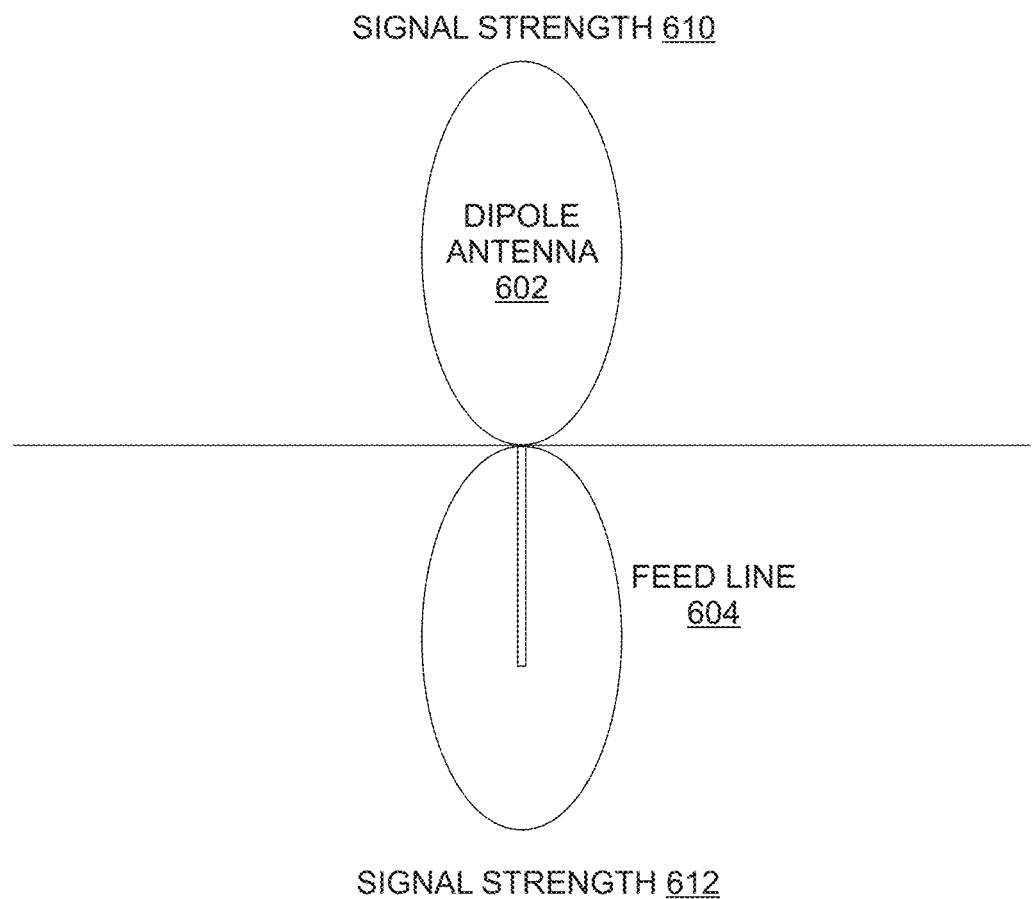
FIG. 6 shows a typical radiation pattern of a horizonal dipole antenna.
Figure 7:
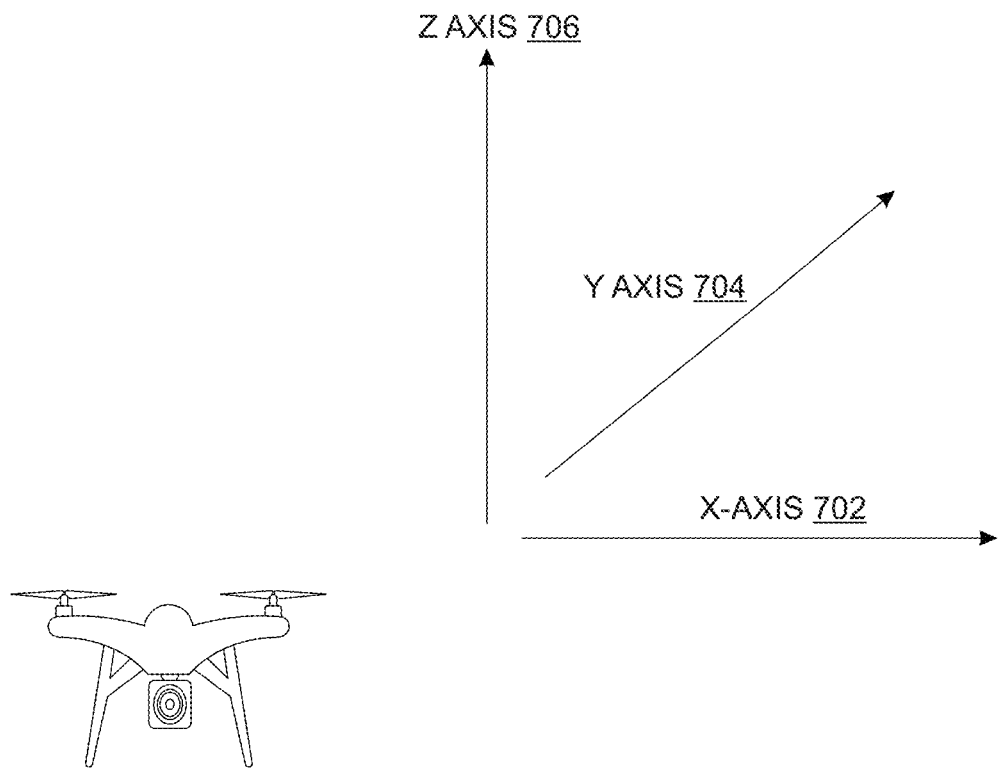
FIG. 7 shows the dimensions of three-dimensional space within which the system operates.

FIGS. 4-6 depict typical antenna radiation patterns

FIG. 4 depicts a quarter-wave vertical monopole 401, a feedline 402, a ground plane 403, and a signal strength contour 404.

FIG. 5 depicts a five-element horizontal yagi 520, a feedline 504, electromagnetic emissions 506, and an autonomous aerial vehicle 508.

FIG. 6 depicts a horizontal dipole antenna 602, a feedline 604, a forward signal strength 610, and a back signal strength 612.

Defining Flight Paths

Measuring Antenna Electromagnetic Emissions

One could achieve the goal of mapping antenna emissions in the vicinity of an antenna by flying in random directions, collecting data on signal intensity and transforming the data into mission contours mathematically through a combination of trigonometry and inverse square extrapolations. Far more efficient, however, is to fly discrete profiles defined in advance or adaptively determined, based on the received signal.

Flight paths are defined with reference to three-dimensional space. The autonomous aerial vehicle 108, operates in three-dimensional space defined along an X-axis 702, a Y axis 704, and a Z axis 706.

The system and method identify specific flight path approaches and allows for embodiments adopting each. Flight paths may be flown in an isodynamic mode, such as in gradient-based navigation, and a constant distance-from-the-antenna mode, as in the hemisphere-based navigation.

The UAV may follow a predefined flight path to conduct measurements at specific azimuths and elevations. The field strength indicator measures signal power levels from a transmitting antenna. The UAV can be programmed to continue to fly in a direction that makes the signal stronger, within a limit so it does not collide with the antenna structure itself.

The UAV antenna may be horizontally or vertically oriented and may comprise a dipole or a monopole. Signal intensity readings are preferably taken with the antenna in constant orientation with respect to the antenna, to avoid signal intensity variation due to UAV antenna directionality. This can be accomplished by directing the antenna to the side of the UAV, so it faces the antenna when the UAV is flown along the circumference of a circle centered on the antenna. Or, it can be accomplished by directing the antenna toward the nose of the UAV and having the UAV fly sideways around the circumference.

A plurality of distinct flight profile is available. Grid-based approaches fly fixed paths. Gradient-based approaches determine flight paths adaptively, depending on what the vehicle detects about radiation patterns. Hemisphere-based approaches fly latitudes (defined as "Slatitudes") around a plurality of hemispheres centered on the antenna.

Three-Dimensional Flight Paths

Antenna radiation patterns are three-dimensional. Therefore, useful data collection strategies for mapping those radiation patterns are three-dimensional. A variety of navigation strategies can map signal-strength contours in three-dimensional space around an antenna.

Predefined Grid Pattern: Fly the UAV in a systematic grid at a constant altitude, recording signal strength at each point. This ensures comprehensive coverage and accurate contour mapping.

Gradient-Based Navigation: Use the signal strength gradient to guide the UAV toward areas of interest, allowing it to follow contours more effectively.

Hemisphere-Based Flight Paths: define hemispheres around an antenna and fly progressively increasing Slatitudes around the hemisphere.

Post-Processing: Collect data at fixed intervals and use software to interpolate and generate power contours, rather than relying on real-time adjustments.

Most antennas are ground-based, although some are airborne, and some are installed on satellites. Radiation patterns of ground-based antennas are greatly affected by the ground underneath the antenna, by the quality of the soil or water, and by the height of the antenna above it. In most cases what is important for communications effectiveness is that part of the radiation pattern above the ground. The low-azimuth part of the pattern accounts for ground waves; the high-azimuth part comprises sky waves.

Grid Pattern

A pre-defined grid pattern strategy is a systematic and straightforward approach for mapping emission power contours using a UAV. It involves flying the UAV over the area of interest in a structured grid-like pattern, collecting signal strength measurements at regular intervals. This method ensures comprehensive coverage of the area and provides a reliable dataset for generating accurate power contours. Below is a detailed explanation of the strategy and the steps for executing it. A hemisphere centered on the antenna provides a reference point for grid definition. The grid slices through the hemisphere at constant Slatitudes.

Key Concepts

1. Grid Pattern: The area is divided into a series of equally spaced points (or cells) in a grid. The UAV flies over these points, collecting data at each location.
2. Constant Altitude: The UAV typically maintains a constant altitude during the flight to ensure consistent measurements.
3. Data Collection: At each grid point, the UAV records the signal strength and its position (e.g., GPS coordinates).
4. Post-Processing: After data collection, the measurements are interpolated to generate a map of signal strength contours.

Steps to Execute the Pre-Defined Grid Pattern Strategy

1. Define the Area of Interest
   Determine the boundaries of the area to be mapped (e.g., using GPS coordinates, a map, or UAV triangulation of antenna position).
   Decide on the resolution of the grid (i.e., the spacing between grid points). A finer grid provides higher resolution but consumes more time and energy.
2. Plan the Grid
   Divide the area into a grid of equally spaced points. For example:
      If the area is 100 m×100 m and the grid spacing is 10 m, the grid will have 11×11 points (121 total points).
   Ensure the grid covers the entire area of interest, including the edges.
3. Set the UAV's Altitude
   Choose a constant altitude for the flight. The altitude should be:
      High enough to avoid obstacles and to measure the far field of the antenna.
      Low enough to capture meaningful signal strength variations.
   Ensure the altitude is maintained throughout the flight.
4. Program the Flight Path
   Use flight planning software to program the UAV to follow the grid pattern. The UAV should:
      Fly in straight lines between grid points.
      Pause briefly at each grid point to take measurements.
      Transition smoothly between rows of the grid (e.g., using a lawnmower pattern).
5. Collect Data
   At each grid point:
      Record the signal strength using the field strength meter.
      Record the UAV's position (e.g., GPS coordinates).
      Optionally, record additional data (e.g., timestamp, altitude, environmental conditions).
6. Ensure Data Quality
   Verify that the UAV is accurately following the grid pattern.
   Check for missing or noisy data points and repeat measurements as appropriate to obtain a complete set.
   Use averaging or filtering to reduce noise in the signal strength measurements.
7. Post-Process the Data
   After the flight, use software to process the collected data:
      Interpolate the signal strength measurements to create a continuous map.
      Generate contour lines or heatmaps to visualize the emission power distribution.
      Tools like MATLAB, Python (with libraries such as NumPy and Matplotlib), or GIS software can be used for this purpose.
8. Analyze and Interpret the Results
   Compare the results with theoretical projects of antenna field strength.
   Use the data for further analysis or decision-making.

Advantages of the Pre-Defined Grid Pattern Strategy

1. Comprehensive Coverage: Ensures that the entire area is systematically covered, reducing the risk of missing important features.
2. Simplicity: Easy to plan and execute, requiring minimal real-time decision-making by the UAV.
3. Repeatability: The same grid pattern can be used for repeated measurements, allowing for comparisons over time.
4. High-Quality Data: Provides a dense and uniform dataset, which is ideal for generating accurate contours.

Practical Considerations

Grid Resolution: Choose a grid spacing that balances resolution with flight time and battery life. A finer grid provides more detail but takes longer to complete.
Flight Time: Ensure the UAV's battery life is sufficient to cover the entire grid. Plan for multiple flights.
Obstacle Avoidance: Ensure the flight path is clear of obstacles, especially in complex environments.
Environmental Factors: Account for factors like wind, temperature, and interference that could affect signal strength measurements.

Example Scenario

To map the radio-frequency (RF) signal strength in a 50 m×50 m area:
1. Define the area and choose a grid spacing of 5 m, resulting in an 11×11 grid (121 points).
2. Program the UAV to fly at a constant altitude of 20m.
3. The UAV follows a lawnmower pattern, moving in straight lines and pausing at each grid point to record signal strength and position.
4. After the flight, use software to interpolate the data and generate a contour map of the signal strength.

Comparison with Gradient-Based Navigation

Pre-Defined Grid Pattern: Better for systematic, comprehensive coverage of an area. Ideal for creating detailed maps but may be less efficient for locating specific features.
Gradient-Based Navigation: More efficient for locating sources or following contours but may miss areas outside the gradient path.

By following the pre-defined grid pattern strategy, the system can reliably and accurately map emission power contours, providing valuable data for analysis and decision-making.

Figure 8:
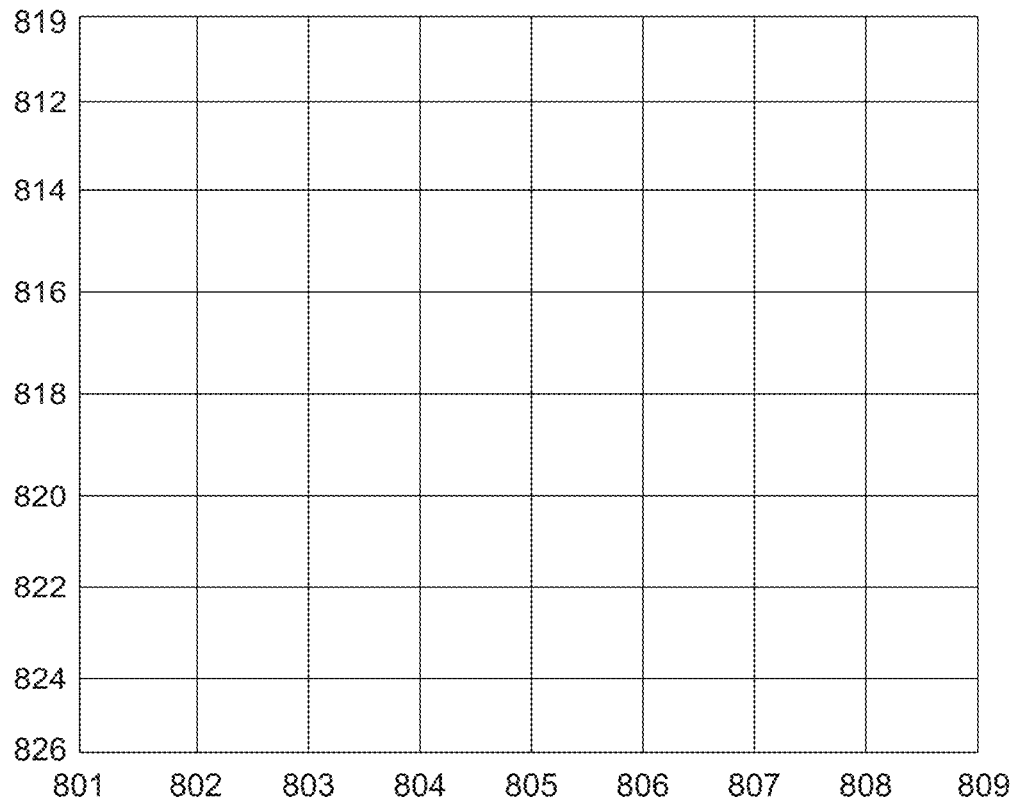
FIG. 8 illustrates a grid-based flight plan.

FIG. 8 is a plan view of a navigation grid. 819 represents the northern boundary, and 826 represents the southern boundary. 801 represents the western boundary, and 809 represents the eastern boundary. The UAV may begin at the intersection of 819 and 801, then fly eastward on 819, turn 180 degrees, and fly westward on 812, turn 180 degrees, and fly eastward on 814, and so on until it has flown the entire grid. On each traverse from west to east and from east to west, it collects field strength data at 802, 803, 804, 805, 806, 807, and 808.

Gradient Based Navigation

In gradient-based navigation the UAV uses the gradient (rate and direction of change) of the signal strength to guide its movement. This approach allows the UAV to follow paths of constant signal strength (contours) or to move toward areas of higher or lower signal strength, depending on the goal. Here's a detailed explanation of how gradient-based navigation works and the steps for executing it:

1. Gradient of Signal Strength: The gradient is a vector that points in the direction of the steepest increase in signal strength. Its magnitude indicates how quickly the signal strength changes.
2. Contour Following: To follow a constant signal strength contour, the UAV moves perpendicular to the gradient.
3. Gradient Ascent/Descent: To move toward higher or lower signal strength, the UAV moves parallel to the gradient.

Steps to Execute Gradient-Based Navigation
1. Initialize the UAV's Position
Start at a known location within far field of the antenna.
Ensure the UAV has a reliable positioning system (e.g., GPS) and a field strength meter to measure signal strength.
2. Measure Signal Strength at the Current Position
Use the field strength meter to record the signal strength at the UAV's current location.
3. Estimate the Gradient
To estimate the gradient, the UAV needs to measure the signal strength at multiple nearby points. This can be done by:
Moving a small distance in the x, y, and z directions (e.g., $\Delta x, \Delta y, \Delta z$).
Recording the signal strength at each new position.
Calculating the partial derivatives of the signal strength with respect to x, y, and z:
$\nabla S=(\partial S \partial x, \partial S \partial y, \partial S \partial z) \nabla S=(\partial x S, \partial y S, \partial z S)$ where S is the signal strength.
4. Determine the Desired Direction of Movement
For Contour Following: Move perpendicular to the gradient. This can be achieved by calculating a direction vector orthogonal to $\nabla S \nabla S$. For example, in 2D, if $\nabla S=(a,b) \nabla S=(a,b)$, a perpendicular direction vector could be $(-b,a)$ $(-b,a)$.
For Gradient Ascent/Descent: Move parallel to the gradient. For ascent, move in the direction of $\nabla S \nabla S$; for descent, move in the opposite direction.
5. Adjust the UAV's Position
Use the desired direction vector to compute the next position:
Ensure the step size is small enough to avoid overshooting but large enough to make progress.
New Position=Current Position+α·Direction VectorNew Position=Current Position+α·Direction Vector where aa is a step size that determines how far the UAV moves in each iteration.
6. Iterate the Process
Repeat steps 2-5 continuously as the UAV moves:
Measure the signal strength at the new position.
Recompute the gradient.
Adjust the direction of movement based on the updated gradient.
7. Handle Noise and Errors
Signal strength measurements can be noisy due to environmental factors (e.g., multipath interference, obstacles). To mitigate this:
Use filtering techniques (e.g., Kalman filters) to smooth the signal strength data.
Average multiple measurements at each point to reduce noise.
8. Terminate When the Goal is Reached
If the goal is to map contours, terminate when the UAV has identified the basic contour shapes.
If the goal is to locate a source or sink of emission, terminate when the signal strength reaches a threshold or stops changing significantly.

Practical Considerations
Computational Requirements: Real-time gradient estimation and navigation utilize onboard processing capabilities.
Obstacle Avoidance: Ensure the UAV can avoid obstacles while following the gradient.
Energy Efficiency: Optimize the step size and flight path to conserve battery life.
3D Navigation: In three dimensions, the gradient has three components, and the UAV adjusts its altitude as well as its horizontal position.

Advantages of Gradient-Based Navigation
Efficiency: The UAV can quickly locate areas of interest (e.g., emission sources) without exhaustive searching.
Adaptability: It works well in dynamic environments where signal strength varies spatially.
Precision: Allows the UAV to follow precise contours or gradients.

Example Scenario

Suppose the UAV is mapping the contours of a radio frequency (RF) signal:
1. The UAV starts at a random position and measures the signal strength.
2. It moves small distances in x, y, and z to estimate the gradient.
3. It computes a direction perpendicular to the gradient to follow a contour.
4. It repeats the process, adjusting its position to maintain constant signal strength.
5. The UAV continues until it has mapped the entire area or reached a termination condition.

By following these steps, gradient-based navigation provides an effective and efficient way to map emission power contours or locate sources of interest.

Gradient-Following Spirals or Helixes

In one variation of the gradient approach, the UAV employs an adaptive spiral flight pattern that progressively maps electromagnetic field strength while maintaining safe distances from the antenna structure. Beginning with a wide perimeter survey at a conservative altitude, the UAV identifies regions of higher signal strength through initial sampling. The system then executes a gradient-following algorithm that directs the UAV to approach areas of increasing field intensity incrementally, constantly adjusting its three-dimensional position to trace signal strength contours. This intelligent navigation continuously calculates optimal measurement points while incorporating proximity sensors, LiDAR, and computer vision systems to maintain a predefined safety buffer from the physical antenna structure. By combining signal strength gradient tracking with dynamic collision avoidance, the UAV can safely navigate to positions of peak electromagnetic field intensity without physical contact with the antenna infrastructure.

Figure 9:
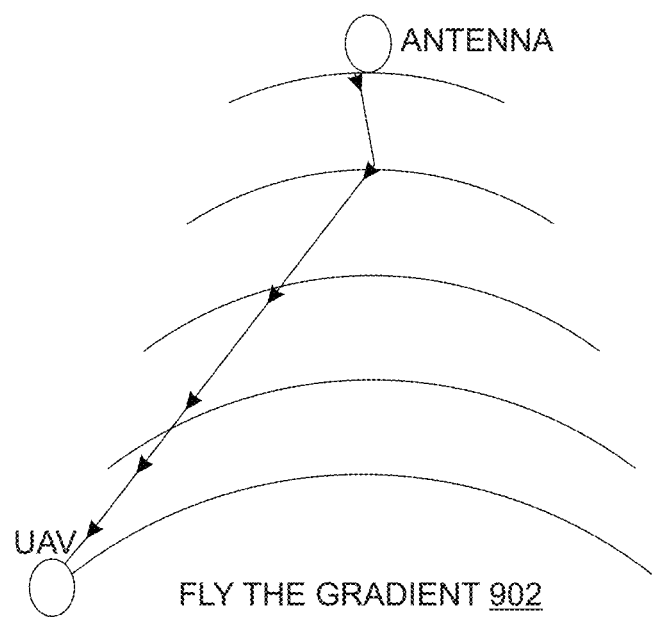
FIG. 9 illustrates a gradient-based flight plan.
Figure 9:
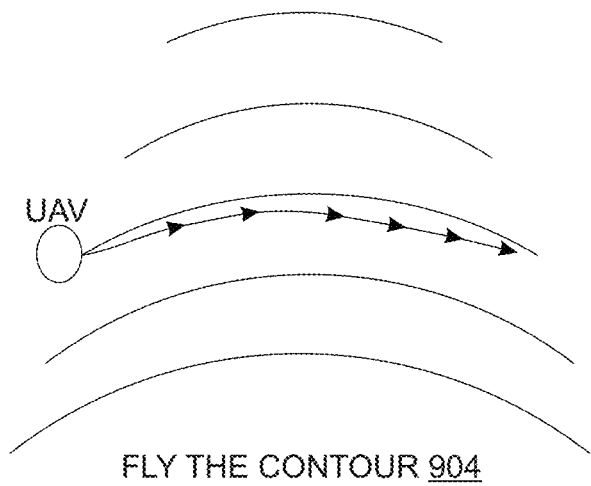

FIG. 9 illustrates gradient-based navigation. The UAV can collect data while it flies a gradient 902 or while it flies a contour 904.

Multi-Phase Sampling

In another variant of the gradient approach, the system implements a multi-phase mapping approach with variable resolution. The UAV first conducts broad sweeps at greater distances to establish a coarse electromagnetic field map, then progressively refines its flight path to focus on regions exhibiting signal anomalies or peak strengths. Safety protocols include real-time obstacle detection that automatically overrides the signal-tracking algorithm when potential collisions are detected. Additionally, the ground station continuously monitors the UAV's proximity to the antenna structure and can implement emergency position adjustments or return-to-home commands if safety thresholds are breached. This hierarchical approach ensures comprehensive mapping of field strength maxima while prioritizing collision avoidance through redundant safety systems and intelligent path planning. The telemetry transmitter sends data to a ground station, where software processes the incoming information and generates detailed field strength maps. These maps are displayed as two- or three-dimensional visualizations, enabling users to assess the signal propagation characteristics of the antenna under examination.

To ensure optimal field strength measurement at the outset of the flight while avoiding collisions with the antenna, the UAV employs a controlled ascent and adaptive path planning. Initially, the UAV ascends vertically to a predefined safe altitude above the antenna to establish a baseline field strength reading. Once at a safe distance, it maneuvers in a helical or radial outward pattern, gradually moving toward positions of higher intensity without crossing paths with the antenna structure. This approach prevents interference with the radiation pattern while ensuring maximum signal acquisition efficiency.

The UAV continuously monitors real-time signal strength data and positional feedback to adjust its trajectory dynamically. Using onboard sensors and obstacle avoidance algorithms, it refines its flight path to avoid structural elements while maintaining optimal proximity to the antenna. This adaptive control ensures that the UAV collects the most accurate field strength data possible without risk of collision, improving the reliability and resolution of the generated electromagnetic field maps.

Hovering in Place

The UAV can be commanded to hover in place to collect data while the transmitter, tuner, and feedline are adjusted.

Hemisphere Sampling

One comprehensive strategy defines virtual hemispheres around the antenna and then flies paths on each spherical surface.

The paths can be a series of Slatitudes, or a series of grids otherwise defined on each spherical surface. Those grids can be defined by different degrees of Slongitude and Slatitude on each surface. The granularity—the angular difference among succeeding Slatitude and Slongitude paths—affects precision of the resulting contour maps on the one hand, but also the amount of time consumed to collect the requisite data on the other hand.

Any effort to fly the 360° orbit around antenna in the Z direction is doomed to failure, because the flight vehicle will collide with the ground. Accordingly, a practical flight profile for measuring and plotting antenna emissions contours can be and should be limited to that half of a virtual sphere extending above the ground—a hemisphere centered on the antenna and confining the UAVs to fly upon or within that hemisphere eliminates the risk of ground contact.

In defining and describing such hemispheres one can refer to the top and bottom along the Z axis as the SNorth pole 1114 and the midpoint as the Sequator 1112, respectively.

When such a hemisphere is defined, a useful flight pattern begins at the SNorth Pole 1114 and flies Slatitudes 1104 to just above the Sequator 1112. The angular difference between adjacent Slatitudes 1104 determines the granularity of the data collection. Smaller angular differences mean better data resolution but also mean longer flight times.

Once a hemisphere 1108 is defined, the UAV flies a constant Slatitude 1104 around it, sampling signal strength, e.g. 610 at predefined Slongitude 1110 values.

The minimum radius of one of these hemispheres 1108 should be a quarter wavelength of the antenna, assuming an antenna of that length. A sphere with a smaller radius cannot be covered without coming into physical contact with the antenna. In practice a minimum radius greater than a few wavelengths is acceptable, because near-field measurement of little interests, because of anomalies introduced by proximate objects that do not affect communications effectiveness.

The maximum radius of the spheres should be determined by the extent of the far-field of the antenna. Reliable emissions contour data from an HF antenna are available beginning in the far-field region, which starts at $2D^2/\lambda$. However, for practical accuracy across the HF band and typical antenna sizes, a distance of at least 300 meters is recommended. This ensures the radiation pattern or field strength contours are stable and representative, though the exact distance depends on the antenna's largest dimension and operating frequency. For precise applications, calculate $2D^2/\lambda$ or aim for 3-10 wavelengths, but for a general guideline, 300 meters suffices for most HF scenarios.

Theory simplifies the data collection problem; the shape of the emission contours is largely predictable, so that the UAV-enable mapping effort is confirming basic shapes and determining intensities in light of real-world effects such as antenna and feed line inefficiencies, ground effect, the effect of nearby foliage and structures, and the effect of terrain such as sloped and mountains.

Inverse-Square Law Extrapolation

The system extends the prior art by using the inverse square law to extrapolate signal strength measurements to arbitrary levels appropriate for drawing emission contours. This disclosure describes a specific mathematical approach using the inverse square law to extrapolate signal strength measurements to generate a mission contours.

Electromagnetic radiation intensity does not vary arbitrarily in the space around an antenna. Rather, the intensity of radiation diminishes in proportion to the reciprocal of the square of the distance from the antenna, according to the inverse square law for calculating free space path loss ("FSPL"). A typical formula is path loss (PL) equals the sum of twenty-times the log-to-the-base-ten times the distance from the transmitting antenna, plus 20 times the log-to-the-base-ten times the frequency, plus 32.44.

This phenomenon can be used to calculate the point at which the intensity value is a defined level based on measurements of the intensity at another point. One draws a vector from the measurement point to the antenna and then uses the formula to calculate intensities at any other point along the vector through such calculations isomers for radiation intensity can be defined representing a mission contours.

If, for example the UAV measures signal intensity as −10 dB at a distance of 600 feet from the antenna, the −3 dB contour would intersect the vector from the UAV to the antenna at a distance of recip log 10 (600) (10 dB−20*log 10 (f)−32.44)/20

Accordingly, the UAV need not fly a large plurality of hemispheres; it can collect data for one or two and use interpolation and extrapolation to compute a mission contours. Data collection on the second hemisphere would serve the purpose of corroborating measurements taken on the first hemisphere.

Theory simplifies the data collection problem; the shape of the emission contours is largely predictable, so that the UAV-enable mapping effort is confirming basic shapes and determining intensities in light of real-world effects such as antenna and feed line inefficiencies, ground effect, the effect of nearby foliage and structures, and the effect of terrain such as sloped and mountains.

Electromagnetic radiation intensity does not vary arbitrarily in the space around an antenna. Rather, the intensity of radiation diminishes in proportion to the reciprocal of the square of the distance from the antenna, according to the inverse square law for calculating free space path loss ("FSPL"). A typical formula is path loss (PL) equals the sum of twenty-times the log-to-the-base-ten times the distance from the transmitting antenna, plus 20 times the log-to-the-base-ten times the frequency, plus 32.44.

This phenomenon can be used to calculate the point at which the intensity value is a defined level based on measurements of the intensity at another point. One draws a vector from the measurement point to the antenna and then uses the formula to calculate intensities at any other point along the vector through such calculations isomers for radiation intensity can be defined representing a mission contours.

If, for example the UAV measures signal intensity as-10 dB at a distance of 600 feet from the antenna, the −3 dB contour would intersect the vector from the UAV to the antenna at a distance of recip log 10 (600) (10 dB−20*log 10(f)−32.44)/20

Accordingly, the UAV need not fly a large plurality of hemispheres; it can collect data for one or two and use interpolation and extrapolation to compute a mission contours. Data collection on the second hemisphere would serve the purpose of corroborating measurements taken on the first hemisphere.

Figure 10:
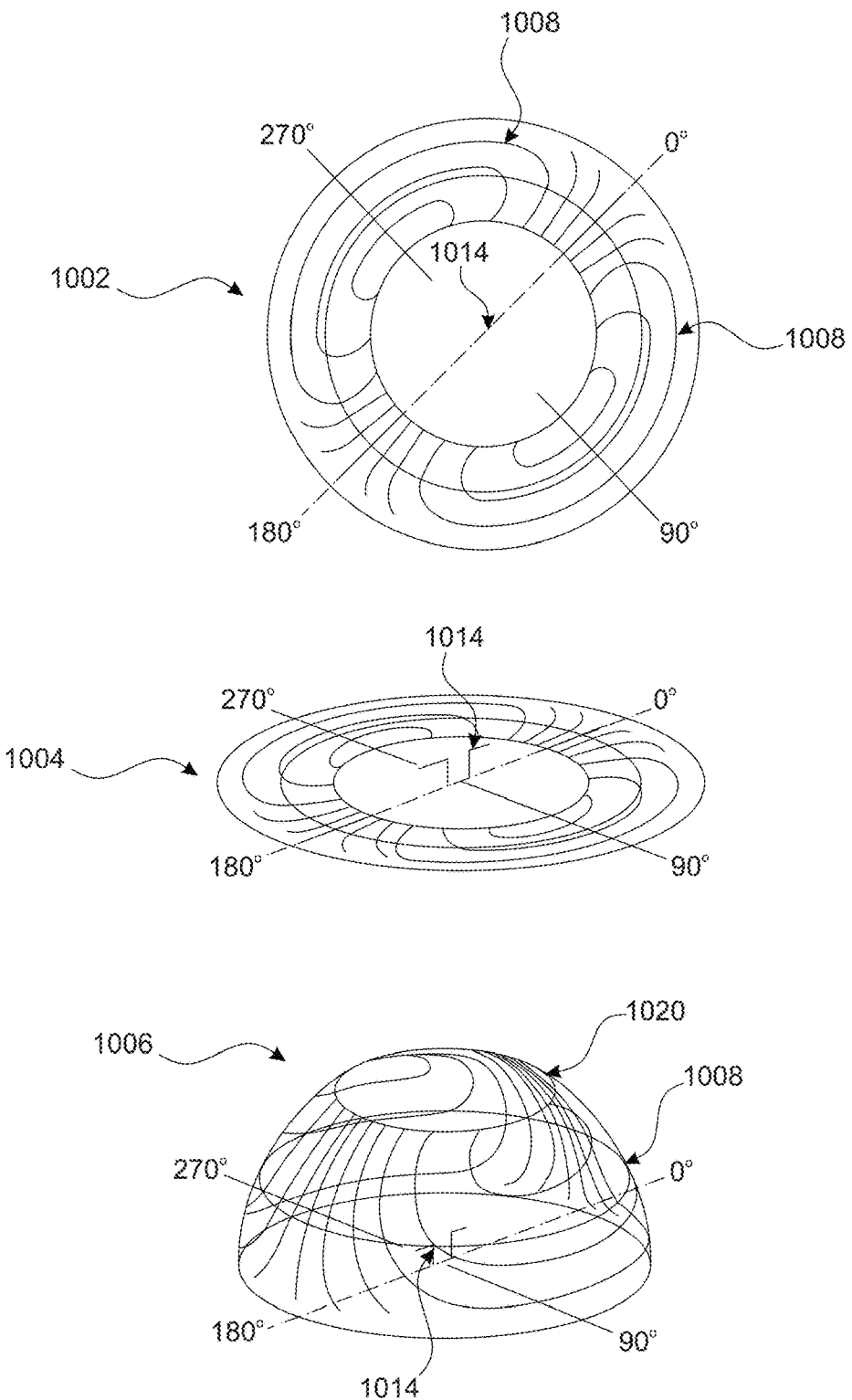
FIG. 10 depicts emission contour lines from three different hemisphere perspectives.

FIG. 10 shows example emissions emission contours 1008 from a plan perspective 1002, an oblique perspective 1004, and a hemisphere perspective 1006.

Figure 11:
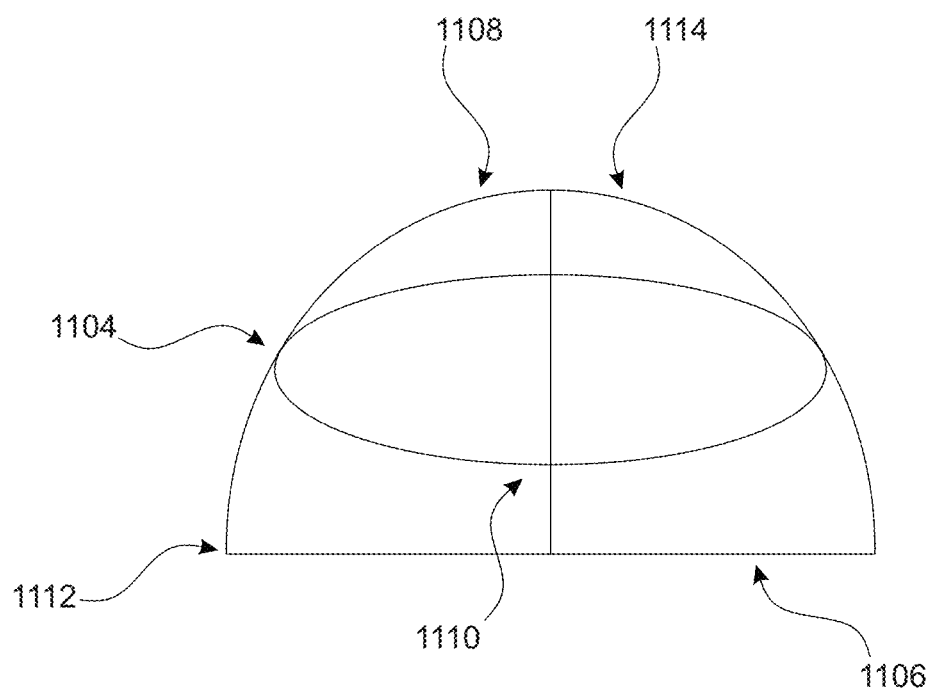
FIG. 11 illustrates a hemisphere-based flight plan.

FIG. 11 shows a hemisphere 1108, the radius of the hemisphere 1106, a line of Slatitude 1104 around the hemisphere, and an Slongitude line marking a point for data collection 1110.

Figure 12:
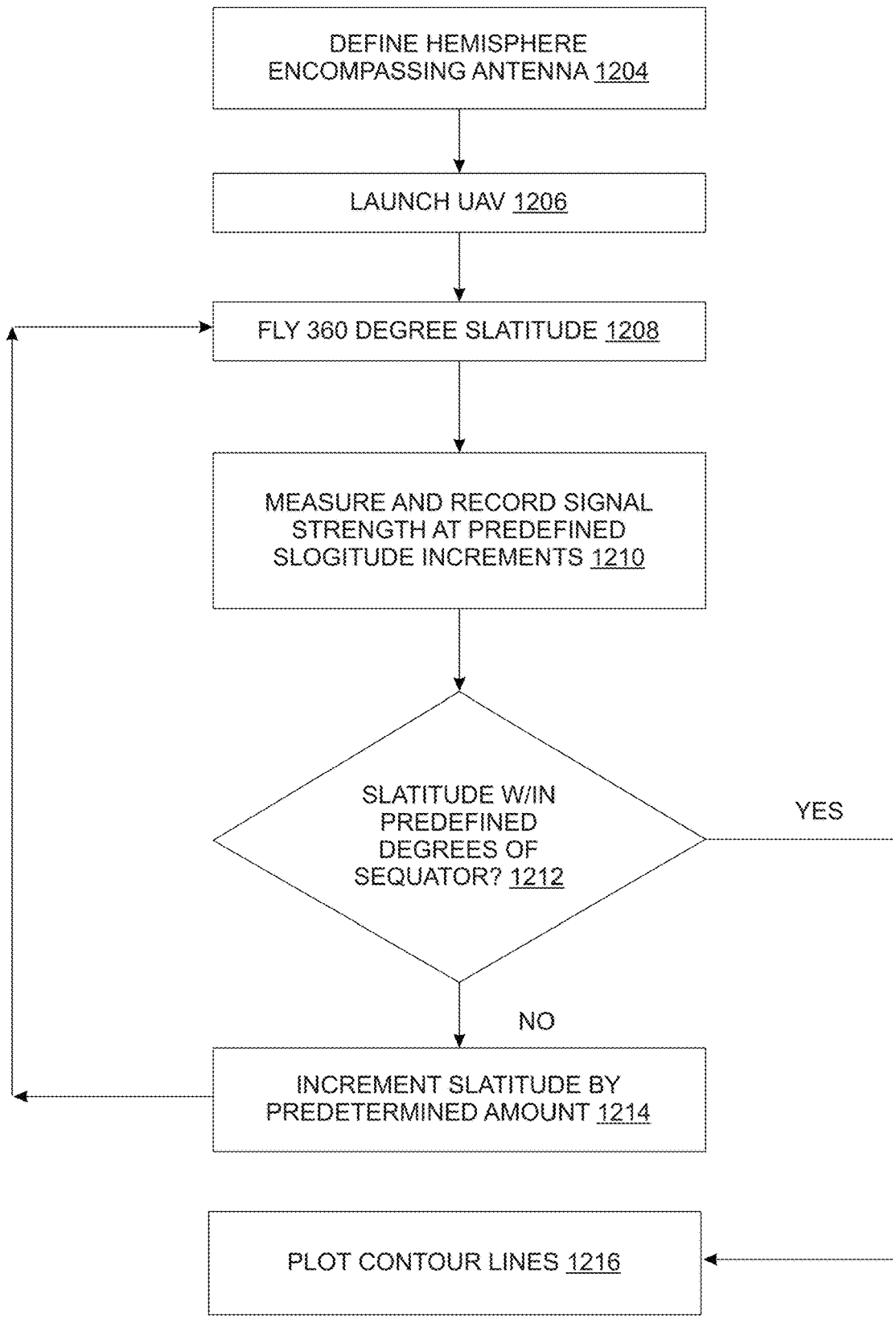
FIG. 12 depicts the steps in hemispheric data collection.

FIG. 12 illustrates the steps in one approach to hemisphere sampling.

A user defines a hemisphere 1108 encompassing the antenna 1004.

He launches the UAV 1206, and the UAV autonomously flies 360 degrees around a specific Slatitude 1208. The UAV autonomously measures and records signal strength at predefined Slongitude increments 1210. The UAV determines whether it is at an Slatitude within a predefined number of degrees of the Sequator 1212. If it is not, the UAV increments the Slatitude by a predetermined amount 1214, and flies the new Slatitude. When the UAV has flown all the Slatitudes above the Sequator, the system plots signal strength contour lines 1216.

Although the example routine depicts a particular sequence of operations, the sequence may be altered without departing from the scope of the present disclosure. For example, some of the operations depicted may be performed in parallel or in a different sequence that does not materially affect the function of the routine. In other examples, different components of an example device or system that implements the routine may perform functions at substantially the same time or in a specific sequence.

Figure 13:
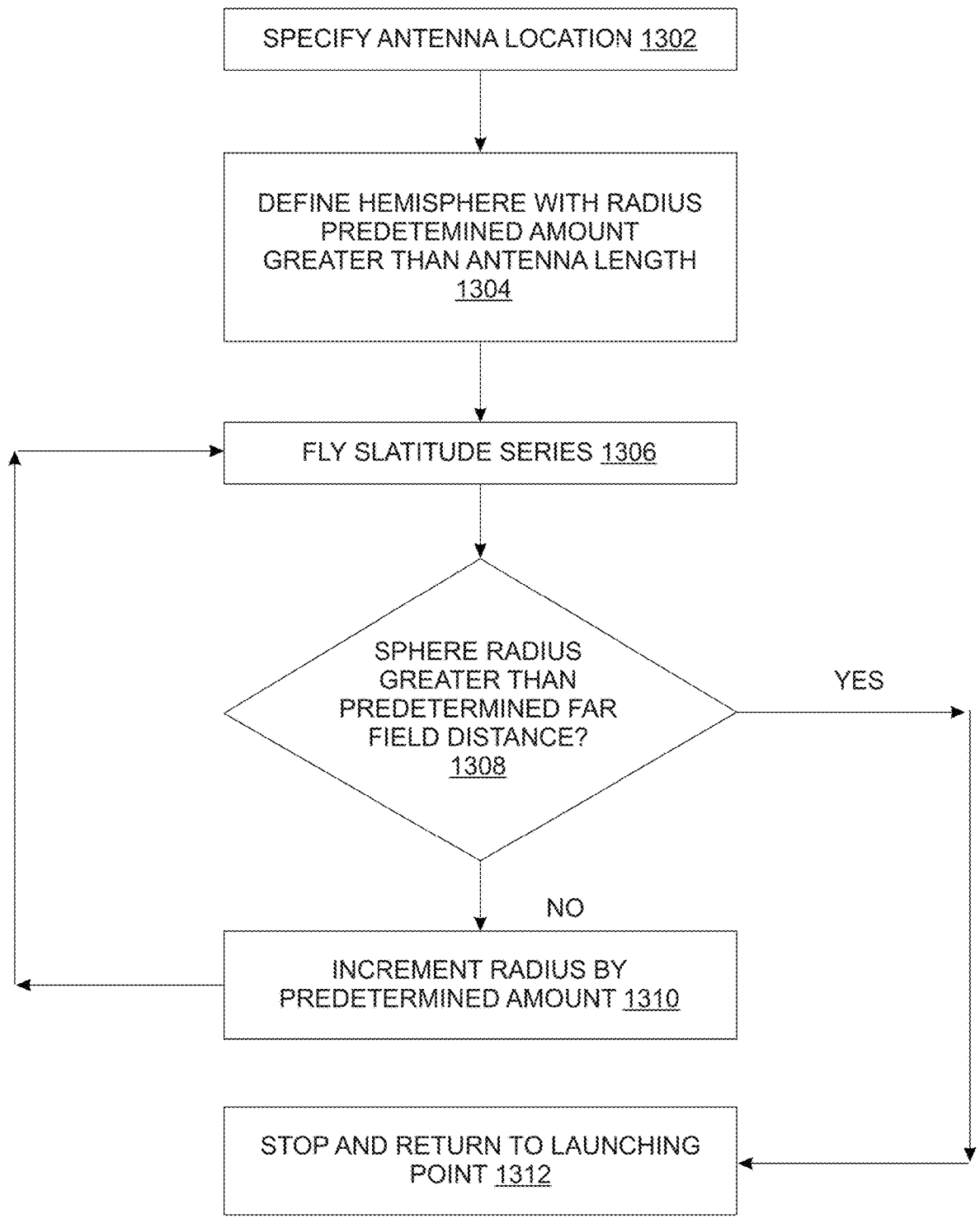
FIG. 13 depicts the steps to increase in the radius of the measurement hemispheres.

FIG. 13 illustrates another example of hemisphere sampling. The user specifies an antenna location, or the system determines it via triangulation 1302. The system defines a hemisphere with a radius with a predetermined amount greater than the antenna length 1304. The UAV autonomously flies a series of Slatitudes 1306. The system autonomously increments the radius of the hemisphere and determines whether the hemisphere radius is greater than a predetermined far field distance 1308. If it is not, the system increments the radius by a predetermined amount 1310. When all Slatitudes for all hemisphere radii have been flown, the UAV stops and return to launching point 1312.

Although the example routine depicts a particular sequence of operations, the sequence may be altered without departing from the scope of the present disclosure. For example, some of the operations depicted may be performed in parallel or in a different sequence that does not materially affect the function of the routine. In other examples, different components of an example device or system that implements the routine may perform functions at substantially the same time or in a specific sequence.

Figure 14:
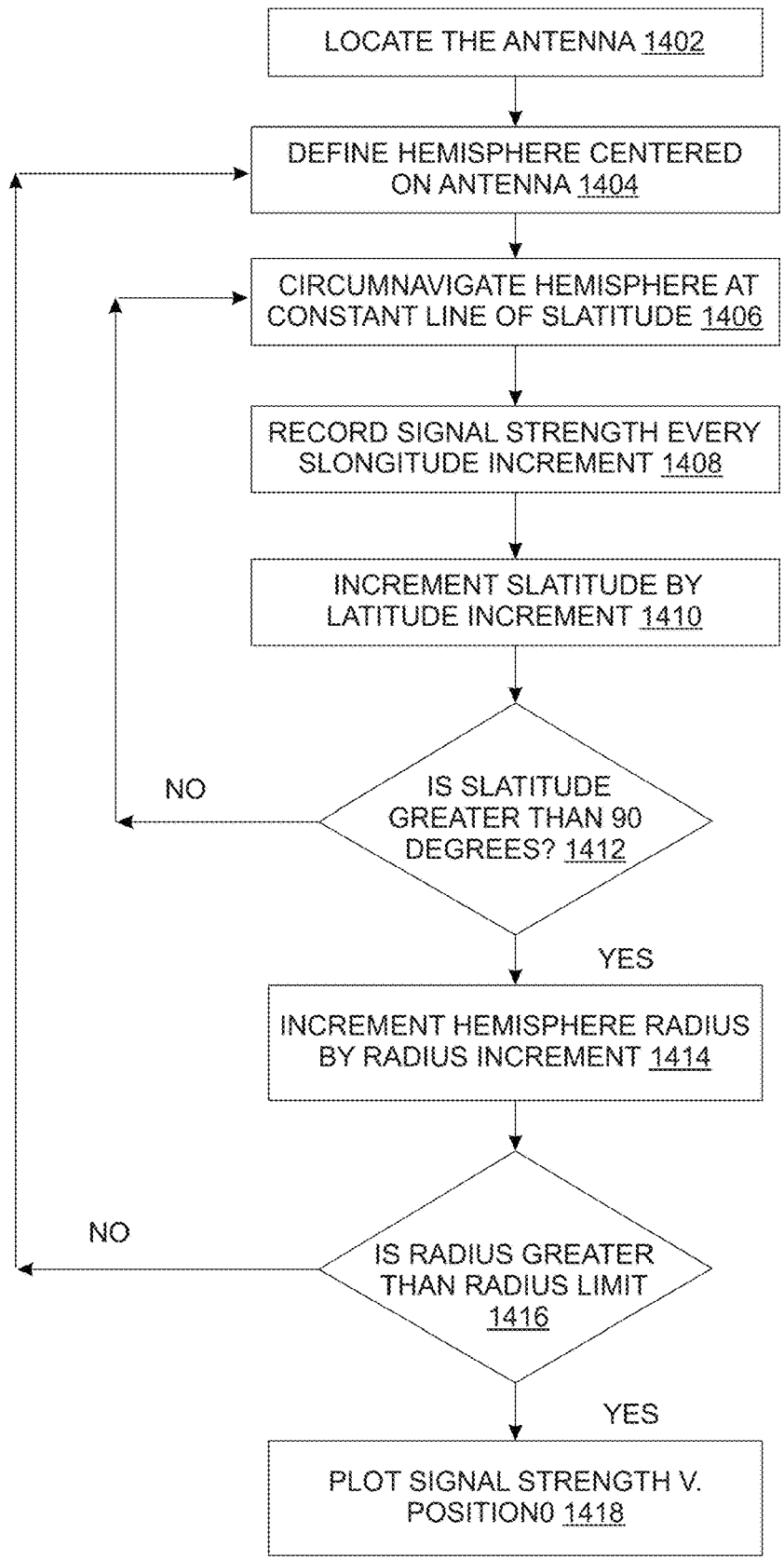
FIG. 14 illustrates the steps to increment latitudes to be flown on a hemisphere.

FIG. 14 illustrates the method for overall operation of the system. The UAV locates the antenna 1402, defines a hemisphere of a particular radius, such as the hemisphere shown in FIG. 10, hemisphere perspective 1006, centered on the antenna 1404. It circumnavigates the hemisphere at constant line of Slatitude 1406, recording signal strength at every increment of Slongitude 1408 along the constant Slatitude. The size of the Slongitude increment is user definable. Then the system increments the Slatitude by a predefined Slatitude increment 1410. It tests whether the Slatitude is greater than 90 degrees 1412. If it is, the system moves to the next step, incrementing hemisphere radius by predetermined amount 1414. If it is not, the system increments the Slatitude within predefined degrees of Sequator. 1410.

When all Slatitudes have been flown for a hemisphere, the system increments hemisphere radius by a predetermined increment 1414 and then flies the newly defined hemisphere as in step 1406.

The method includes testing whether each hemisphere radius increment produces a radius greater than the radius limit 1416. If it is, the system stops incrementing the radius of the hemisphere. If it is not, the system increments the radius of the hemisphere by a predetermined amount 1310.

Having collected all the field strength data for all the hemispheres, the system plots signal strength v. position 1418.

Although the example routine depicts a particular sequence of operations, the sequence may be altered without departing from the scope of the present disclosure. For example, some of the operations depicted may be performed in parallel or in a different sequence that does not materially affect the function of the routine. In other examples, different components of an example device or system that implements the routine may perform functions at substantially the same time or in a specific sequence.

Altitude Control

The control unit software commands the UAV not to fly more than 400 feet above ground level, or more than 400 feet above or within 400 feet laterally of a structure—the current limits imposed by the Federal Aviation Administration. 14 CFR § 107.51 (b). The numerical value of this altitude limit can be changed by the user if the regulations change.

To avoid exceeding the 400-foot limit, hemisphere radius is limited to 350 feet, and therefore the height of flight maneuvers. The control unit software will only decrement, not increment, the hemisphere radius as it collects data. When contours extending higher than 350 feet are needed, the system extrapolates those data points using the inverse squares law applied to data points collected at altitudes lower than 350 feet.

User Adjustment of Parameters

Users can predefine the resolution and granularity of measurements, adjusting the UAV's trajectory and data collection frequency based on mission objectives. The system allows for the assessment of signal strength in complex environments, including urban landscapes and remote areas.

Computer program code runs on a control unit and sends commands to the UAV through a command transmitter on the control unit and a command receiver on the UAV. The program code comprises a plurality of flight modes, any of them selectable by the operator.

In the isodynamic mode, the control program code commands the UAV to fly a pattern in which signal strength is equal. After the isodynamic flight pattern is complete, the computer program code generates a map showing the isodynamic signal contour with respect to the antenna.

In the constant distance mode, the control program code commands the UAV to hover in position and to collect multiple emitted power readings as the operator adjusts transmitter, tuner, and feedline.

Data Recording

Data recording occurs with all modes. The control program code commands the UAV to stop movement periodically to record a data point. The entry of the data point occurs autonomously.

The control unit's software generates field strength charts and three-dimensional maps.

Control program code enters the values of UAV position, and operator-entered data points in a data structure. For example, when the data recording mode is combined with the constant distance mode, the entries in the data structure may show: "LAT: 38.070285383256284 LONG:- 78.4312479746586 ALT: 128 ft V/M: 1.10 NOTE: 'Transmitter output 250 watts, RG-58 feedline, SWR 1.6.'"

The system and method address a specific problem not addressed in the prior art: how to measure modulated signals effectively. The intensity of single-side-band signals are particularly difficult to measure because emitted power varies with speech intensity. Morse code and digital modes intersperse the absence of signals with their presence, causing similar measurement problems. The system overcomes difficulties in measuring the intensity of a modulated signal by using digital field-strength meters that measure peak intensity, with a time constant appropriate for the transmitted frequency, causing the meter output to "hang" on the highest intensity detected. After a reading has been recorded, the meter is released to take the next measurement as the UAV moves.

CONCLUSION

The system and method uniquely describe an integrated approach with multiple flight modes including an isodynamic mode and a constant distance mode, with a plurality of flight patterns within each. This integrated approach combines multiple measurement technologies methodologies not found in any single reference or logical combination of the references. The combination of his hemispheric-based flight patterns, inverse square law extrapolation, triangulation, multiple integrated measurement modes, and interpolation of modulated signals represent a significant, advancement over prior art it would not have been obvious to a person of ordinary skill based on the cited references.

The system's use of hemisphere-based flight paths and gradient-following approaches provide more flexibility and more concrete specification of UAV behavior than in the prior art. In some enablements, the system actively adjusts flight paths to follow electromagnetic radiation contours, unlike the prior art, which either does not define flightpath behavior or limits it to fixed predefined vertical measurements.

The system introduces gradient following adaptive flight patterns allowing real-time trajectory adjustments to follow signal contours unlike much of the prior art which relies on preprogrammed flight paths The system does not require pre-defining a static UAV trajectory The prior art provides no teaching, suggestion, or motivation to modify their methods for spherical RF emission mapping.

The system uses triangulation-based antenna location means, wherein the UAV determines the latitude, longitude and elevation of the antenna; the prior art provides no means of locating an antenna but assumes that antenna location and dimensions are input by the user.

The system employs unique computational aspects to extrapolate field-strength contours using the inverse square law and multiple sampling techniques. A person skilled in the art would not naturally modify the network optimization systems and safety enhancement systems disclosed in the prior art to incorporate the system's hemispherical signal contour interpolation. The system uses triangulation-based antenna location means, wherein the UAV determines the latitude, longitude and elevation of the antenna; the prior art provides no means of locating an antenna, but assumes that antenna location and dimensions are input by the user.

The system employs unique computational aspects to extrapolate field-strength contours using the inverse square law and multiple sampling techniques. A person skilled in the art would not naturally modify the network optimization systems and safety enhancement systems disclosed in the prior art to incorporate the system's hemispherical signal contour interpolation.

I claim:

1. A system for measuring electromagnetic field strength, comprising:
   an unmanned aerial vehicle (UAV) comprising:
      a propulsion system;
      a plurality of batteries;
      a field strength indicator;
      a three-dimensional field strength indicator;
      a global positioning satellite (GPS) module, configured to record spatial coordinates of the UAV;
      a navigation system;
      a telemetry transmitter that transmits field strength data to a control unit; and
      a local coordinate system centered on a target such as an antenna, with latitude (Slatitude) and longitude (Slongitude) defined in such local coordinate system;
      a processing unit that
      integrates sensor data;
      associates field strength values with recorded coordinates in the local coordinate system; and
      converts data in the local coordinate system to data representations relative to geographic coordinates received from the UAV's navigation system;

the control unit is located on the ground configured to receive telemetry data and generate visual representations of field strength readings;

a software defined radio receiver capable of
processing signals received from an antenna;
associating them with geographic coordinates relative to the local coordinate system; and a ground station, wherein the control unit is part of the ground station; and computer program code, wherein
the UAV autonomously determines a latitude, longitude, and elevation of an antenna by direction-finding triangulation using multiple bearing measurements taken from different spatial positions; and the computer program code does not permit the UAV to fly above the altitude limits imposed by Federal Aviation Administration (FAA) regulations; wherein the control unit causes the UAV to fly a pattern defined by the local coordinate system centered on the antenna, comprising, first a grid pattern, followed by a gradient pattern in which the UAV flies across lines of varying signal strength, followed by an isodynamic pattern, in which the UAV flies lines of constant signal strength.

2. The system of claim 1, wherein the UAV follows a predefined flight path based on the field strength values to conduct measurements at multiple azimuths and elevations.

3. The system of claim 1, wherein the field strength indicator measures signal power levels from a transmitting antenna, wherein the predefined flight path comprises flying lines of constant Slatitude in the local coordinate system around a hemisphere of defined radii centered on the antenna.

4. The system of claim 1, wherein the telemetry transmitter provides real-time data transmission to the ground station.

5. The system of claim 1, wherein the control unit's software generates field strength charts and three-dimensional maps.

6. The system of claim 1, wherein the UAV is equipped with cameras and additional sensors to enhance mapping accuracy.

7. The system of claim 1, wherein a user can define measurement granularity before each mission or during flight.

8. The system of claim 1, wherein the UAV operates autonomously or under remote control.

9. The system of claim 1, wherein:
the control unit's software causes the UAV to fly a pattern in which signal strength is equal, wherein the pattern comprises an isodynamic flight mode following electromagnetic field strength contours; and
the control unit software generates a map of signal strength contours using inverse square law extrapolation to calculate field strength values at distances different from measurement points.

10. The system of claim 1, wherein:
a user can command the UAV to hover in position and collect multiple emitted power readings as transmitter, tuner, and feedline are adjusted.

11. The system of claim 1, wherein signal frequencies are limited to HF, defined as 1.6 to 30 MHz.

* * * * *